(12) United States Patent
Chao et al.

(10) Patent No.: US 10,109,742 B2
(45) Date of Patent: Oct. 23, 2018

(54) SEMICONDUCTOR DEVICE INCLUDING FIN STRUCTURES AND MANUFACTURING METHOD THEREOF

(71) Applicant: TAIWAN SEMICONDUCTOR MANUFACTURING CO., LTD., Hsinchu County (TW)

(72) Inventors: Yuan-Shun Chao, Zhubei (TW); Chih-Pin Tsao, Zhubei (TW); Hou-Yu Chen, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/872,083

(22) Filed: Sep. 30, 2015

(65) Prior Publication Data

US 2017/0092770 A1 Mar. 30, 2017

(51) Int. Cl.
*H01L 29/78* (2006.01)
*H01L 29/49* (2006.01)
(Continued)

(52) U.S. Cl.
CPC ...... *H01L 29/7854* (2013.01); *H01L 27/0886* (2013.01); *H01L 29/0653* (2013.01);
(Continued)

(58) Field of Classification Search
CPC .......... H01L 27/0886; H01L 27/0924; H01L 27/1211; H01L 21/823431;
(Continued)

(56) References Cited

U.S. PATENT DOCUMENTS 9,224,864 B1* 12/2015 Wu .................. H01L 29/7848
2013/0049068 A1* 2/2013 Lin .................. H01L 29/7853
257/192
(Continued)

FOREIGN PATENT DOCUMENTS

TW 201528436 A 7/2015

OTHER PUBLICATIONS

Office Action Taiwanese Patent Application No. 104137834 dated Dec. 27, 2016.
(Continued)

*Primary Examiner* — Bryan Junge
(74) *Attorney, Agent, or Firm* — McDermott Will & Emery LLP

(57) ABSTRACT

A method for manufacturing a semiconductor device includes forming a fin structure over a substrate. The fin structure has a top surface and side surfaces and the top surface is located at a height H0 measured from the substrate. An insulating layer is formed over the fin structure and the substrate. In the first recessing, the insulating layer is recessed to a height T1 from the substrate, so that an upper portion of the fin structure is exposed from the insulating layer. A semiconductor layer is formed over the exposed upper portion. After forming the semiconductor layer, in the second recessing, the insulating layer is recessed to a height T2 from the substrate, so that a middle portion of the fin structure is exposed from the insulating layer. A gate structure is formed over the upper portion with the semiconductor layer and the exposed middle portion of the fin structure.

20 Claims, 6 Drawing Sheets

(51) Int. Cl.
*H01L 27/088* (2006.01)
*H01L 29/06* (2006.01)
*H01L 29/10* (2006.01)
*H01L 29/66* (2006.01)

(52) U.S. Cl.
CPC ...... *H01L 29/1037* (2013.01); *H01L 29/4966* (2013.01); *H01L 29/66795* (2013.01); *H01L 29/7851* (2013.01)

(58) Field of Classification Search
CPC .......... H01L 21/823821; H01L 21/845; H01L 29/66795–29/66818; H01L 29/785–29/7856; H01L 29/495; H01L 29/4958; H01L 29/4966
See application file for complete search history.

(56) References Cited

U.S. PATENT DOCUMENTS

2013/0092984 A1* 4/2013 Liu ................... H01L 29/66795 257/288
2013/0196478 A1* 8/2013 Chang ................. H01L 29/7853 438/283
2013/0244396 A1* 9/2013 Oh .................... H01L 29/66795 438/400
2015/0102392 A1* 4/2015 Yu ................... H01L 21/823431 257/288
2015/0270345 A1* 9/2015 Hwang ............... H01L 29/7854 257/401
2016/0197082 A1 7/2016 Park et al.

OTHER PUBLICATIONS

Jack Kavalieros, et. al., "Tri-Gate Transistor Architecture with High-k Gate Dielectries, Metal Gates and Strain Engineering", 2006 Symposium on VLSI Technology Digest of Technical Papers, IEEE, 2006.

Jack Kavalieros, et. al., "Tri-Gate Transistor Architecture with High-k Gate Dielectries, Metal Gates and Strain Engineering", Intel Corporation Components Research Technology Manufacturing Group, Jun. 13, 2006.

* cited by examiner

SEMICONDUCTOR DEVICE INCLUDING FIN STRUCTURES AND MANUFACTURING METHOD THEREOF

TECHNICAL FIELD

The disclosure relates to a semiconductor integrated circuit, and more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin devices (e.g., wrapping) utilizing the advantage of the increased surface area of the channel and source/drain regions to produce faster, more reliable and better-controlled semiconductor transistor devices. In Fin FET devices, the upper portion of the fin structure functions as a channel, while the lower portion of the fin structure functions as a well.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-6 show exemplary cross sectional views illustrating sequential processes for manufacturing a Fin FET device according to one embodiment of the present disclosure. It is understood that additional operations can be provided before, during, and after processes shown by FIGS. 1-6, and some of the operations described below can be replaced or eliminated, for additional embodiments of the method. The order of the operations/processes may be interchangeable.

Figure 1:
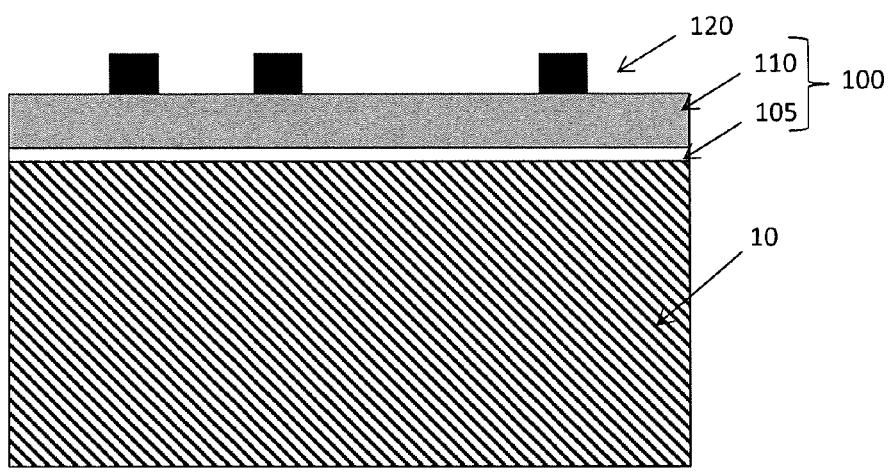
FIGS. 1-6 show exemplary cross sectional views illustrating sequential processes for manufacturing a Fin FET device according to one embodiment of the present disclosure.

As shown in FIG. 1, a mask layer 100 is formed over a substrate 10 by, for example, a thermal oxidation process and/or a chemical vapor deposition (CVD) process. In one embodiment, the substrate 10 is, for example, a p-type silicon substrate with an impurity concentration being in a range of about $5\times10^{14}$ cm$^{-3}$ and about $5\times10^{15}$ cm$^{-3}$. In other embodiments, the substrate 10 is an n-type silicon substrate with an impurity concentration being in a range of about $5\times10^{14}$ cm$^{-3}$ and about $5\times10^{15}$ cm$^{-3}$. Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer 100 includes, for example, a pad oxide (e.g., silicon oxide) layer 105 and a silicon nitride mask layer 110 in some embodiments. The pad oxide layer 105 may be formed by using thermal oxidation or a CVD process. The silicon nitride mask layer 110 may be formed by a physical vapor deposition (PVD), such as sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 105 is in a range of about 2 nm to about 15 nm and the thickness of the silicon nitride mask layer 110 is in a range of about 2 nm to about 50 nm in some embodiments. A mask pattern 120 is further formed over the mask layer 100. The mask pattern 120 is, for example, a photo resist pattern formed by photo lithography.

By using the mask pattern 120 as an etching mask, a hard mask pattern of the pad oxide layer 105 and the silicon nitride mask layer 100 is formed. The width of the hard mask pattern is in a range of about 5 nm to about 20 nm in some embodiments. In certain embodiments, the width of the hard mask patterns is in a range of about 7 nm to about 12 nm.

Figure 2:
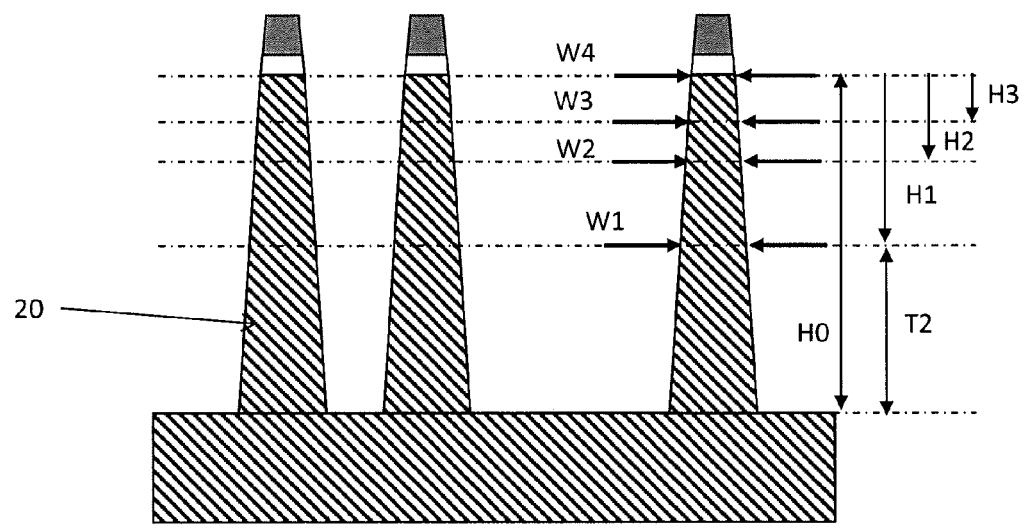

As shown in FIG. 2, by using the hard mask pattern as an etching mask, the substrate 10 is patterned into fin structures 20 by trench etching using a dry etching method and/or a wet etching method. A height H0 of the fin structure 20 is in a range of about 100 nm to about 300 nm. In certain embodiments, the height H0 is in a range of about 50 nm to about 100 nm. When the heights of the fin structures are not uniform, the height H0 from the substrate may be measured from the plane that corresponds to the average heights of the fin structures.

In FIG. 2, three fin structures 20 are disposed over the substrate 10 and extend in the X direction and are arranged in the Y direction. However, the number of the fin structures is not limited to three. The numbers may be as small as one, or four or more. In addition, one or more dummy fin structures may be disposed adjacent both sides of the fin structures 20 to improve pattern fidelity in patterning processes. In some embodiments, the pitch of the plurality of fin structures is constant.

In this embodiment, a bulk silicon wafer is used as a starting material and constitutes the substrate 10. However, in some embodiments, other types of substrate are used as the substrate 10. For example, a silicon-on-insulator (SOI) wafer may be used as a starting material, and the insulator layer of the SOI wafer constitutes the substrate 10 and the silicon layer of the SOI wafer is used for the fin structure 20.

In FIG. 2, the height H1 correspond to the height of the channel region of the Fin FET measured from the top of the fin structure. As described below, the height H1 is a distance between the top of the fin structure to the surface of the isolation insulating layer, along the vertical (Z) direction. H1 may also be defined by H0-T2, where T2 is a height (level) of the surface of the isolation insulating layer. The height H2 is about 50% of the height H1 from the top of the fin structure, and the height H3 is about 25% of the height H1 from the top of the fin structure. When the surface of the isolation insulating layer is not flat, the height H1 is defined by the average heights of the surface of the isolation insulating layer 30. In other embodiments, H2 may be about 40-60% of H1 and H3 may be about 20-30% of H1.

After the fin structures are formed, the width W1 of the fin structure at the height H1 is in a range of about 10 nm to 20 nm in some embodiments, or is in a range of about 12 nm to about 18 nm in other embodiments. The width W2 of the fin structure at the height H2 is in a range of about 9 nm to 18 nm in some embodiments, or is in a range of about 10 nm to about 16 nm in other embodiments. The width W3 of the fin structure at the height H3 is in a range of about 8 nm to 16 nm in some embodiments, or is in a range of about 9 nm to 15 nm in other embodiments. The width W4 of the fin structure near the top of the fin structure is in a range of about 6 nm to 15 nm in some embodiments, or is in a range of about 8 nm to about 14 nm in other embodiments.

Figure 3:
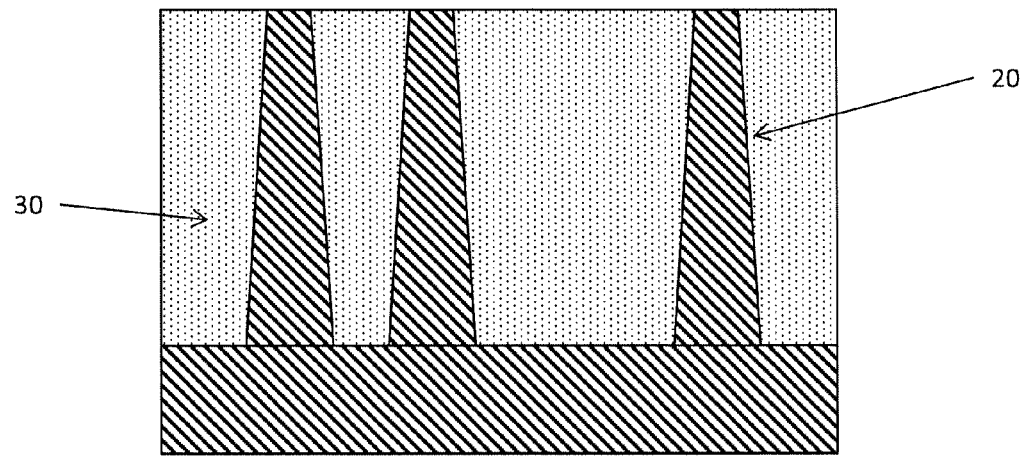

As shown in FIG. 3, an isolation insulating layer 30 (or so-called a "shallow-trench-isolation (STI)" layer) is formed over the substrate 10 and the fin structure 20. A blanket layer of an insulating (or dielectric) material is formed over the substrate 10 so that the fin structures 20 are fully embedded in the blanket insulating layer, and then a planarization operation such as a chemical mechanical polishing (CMP) process or an etch-back process is performed so as to expose the top surface of the fin structures. During the planarization operation, the hard mask pattern is removed.

The isolation insulating layer 30 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The isolation insulating layer 30 may be formed by using SOG. In some embodiments, SiO, SiON, SiOCN or fluorine-doped silicate glass (FSG) may be used as the isolation insulating layer 30. After forming the isolation insulating layer 30, a thermal process, for example, an anneal process, may be performed to improve the quality of the isolation insulating layer 30.

Figure 4:
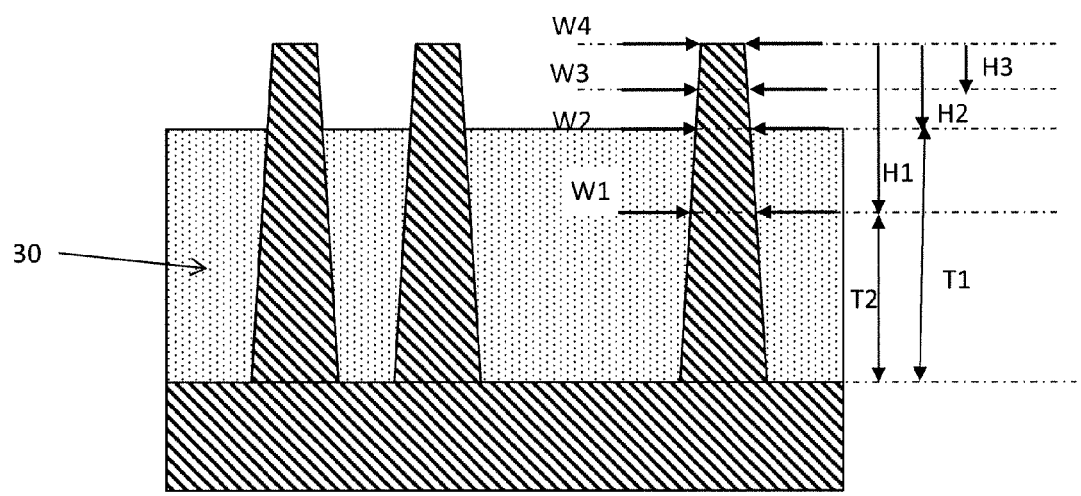

Next, as shown in FIG. 4, the thickness of the isolation insulating layer 30 is reduced by, for example, an etch-back process, to the height H2, or height T1 as measured from the substrate. The etch-back process may be performed by remote plasma etching using $NF_3$ and $NH_3$ gas. By adjusting etching time, a desired thickness of the isolation insulating layer 130 can be obtained. By reducing the thickness of the isolation insulating layer 30, an upper part of the fin structure (about 50% of the channel region) is exposed.

During the formation of the isolation insulating layer 30 and recessing the isolation insulating layer 30, the fin structures 20 slightly lose their width. For example, after the isolation insulating layer 30 is recessed, the width W1 of the fin structure at the height H1 is in a range of about 8 nm to 18 nm in some embodiments, or is in a range of about 10 nm to about 16 nm in other embodiments. The width W2 of the fin structure at the height H2 is in a range of about 7 nm to 16 nm in some embodiments, or is in a range of about 8 nm to about 14 nm in other embodiments. The width W3 of the fin structure at the height H3 is in a range of about 5 nm to 13 nm in some embodiments, or is in a range of about 6 nm to about 12 nm in other embodiments. The width W4 of the fin structure near the top of the fin structure is in a range of about 4 nm to 12 nm in some embodiments, or is in a range of about 5 nm to about 10 nm in other embodiments.

Figure 5:
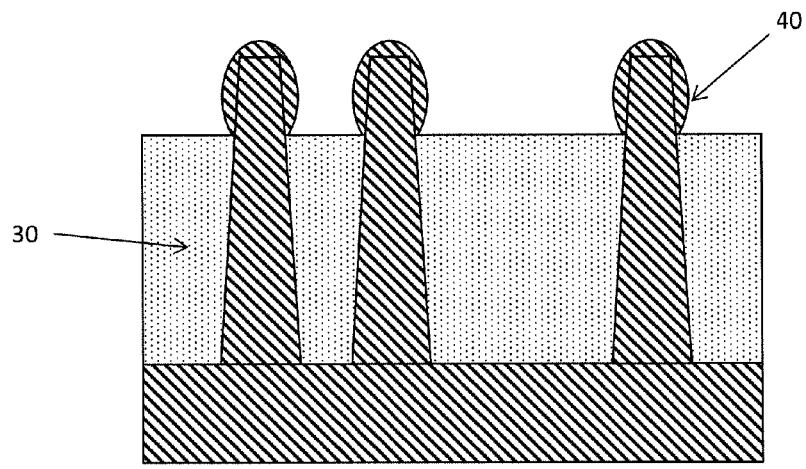

Then, as shown in FIG. 5, an epitaxial layer 40 is formed over the exposed upper portions of the fin structures 20. In one embodiment, a Si epitaxial layer 40 is formed over the exposed upper portions with a thickness in a range of about 0.5 nm to about 2 nm. In other embodiments, the thickness of the Si epitaxial layer is in a range of about 0.8 nm to about 1.2 nm.

The Si epitaxial layer 40 may be formed by CVD, ALD or MBE (molecular beam epitaxy) using $SiH_4$, $Si_2H_6$ and/or $SiH_2Cl_2$ is used as a source gas. The epitaxial layer 40 is doped with appropriate dopants such as C, B, P or As or is intrinsic in other embodiments. In some embodiments, the upper portion of the fin structure 20 is made of Ge or SiGe. The epitaxial layer 40 includes Ge or SiGe in other embodiments.

Figure 6:
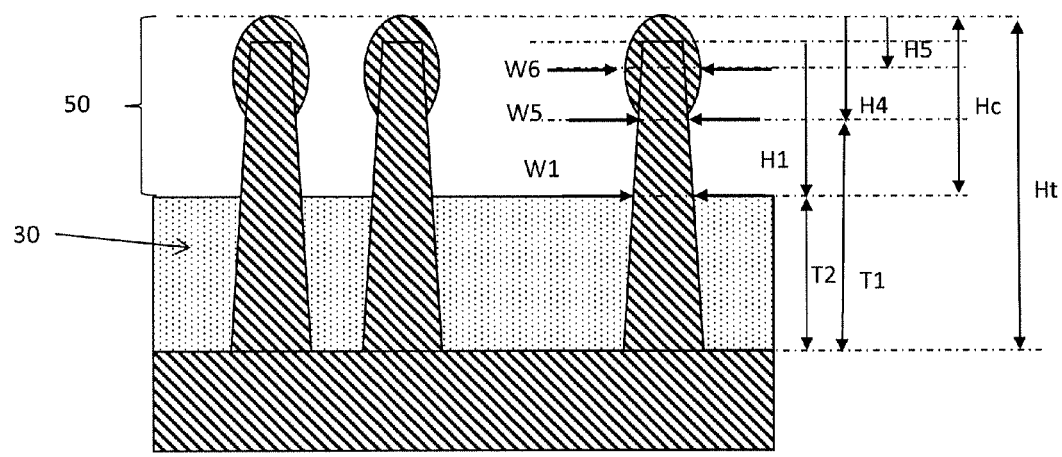

As shown in FIG. 6, the thickness of the isolation insulating layer 30 is further reduced to the height H1. As shown in FIG. 6, the cross section of the upper portion of the fin structure is generally an oval, and the entire cross sectional shape of the fin structures is similar to a "bowling pin." The fin structure above the upper surface of the isolation insulating layer, which will become a channel region 50 of the Fin FET, the width of the fin structure along the Y direction changes as follows. At the level just above the upper surface of the isolation insulating layer (substantially at the height H1), the fin structure has the width W1. The width of the fin structure decreases as the distance from the upper surface of the isolation insulating layer increases (upward direction), and has a minimum width W5 at a level (or height) H4 measured from the top of the fin structure 20 with the epitaxial layer 40. Then, as the distance from the upper surface of the isolation insulating layer further increases toward the top of the fin structure, the width become a maximum W6 at a level H5 measured from the top of the fin structure 20 with the epitaxial layer 40. In one embodiment, W5<W1<W6, and in other embodiments, W5<W6<W1, and in such a case the W6 is a local maximum above H4. In some embodiments, W6/W5 is in a range of about 1.1 to about 1.5 and is in a range of about 1.15 to 1.3 in other embodiments.

In some embodiments, the height T1 measured from the substrate to the surface of insulating layer after the first recessing is in a range of the height T2 measured from the substrate to the surface of the insulating layer after the second recessing plus 40% to 60% of the difference between the height of the top surface of the fin structure H0 and the height T2 of the insulating layer after the second recessing. In other words, T1 is in a range of T2 plus 40% to 60% of (H0-T2). In certain embodiments, T1 is in a range of T2 plus 70% to 80% of (H0-T2).

The level H4 is located at about 20% to about 60% of the total channel height Hc from the top of the channel region in some embodiments, and in other embodiments, is located at about 25% to 50% of Hc from the top. The level H5 is located at about 5% to about 50% of the total channel height Hc from the top of the channel region in some embodiments, and in other embodiments, is located at about 10% to 40% of Hc from the top. Hc may also be defined by Ht-T2, where T2 is a height (level) of the surface of the remaining isolation insulating layer and Ht is a total height of the fin structure from the substrate.

The width W1 of the fin structure at the height H1, after the isolation insulating layer is second recessed, is in a range of about 8 nm to 18 nm in some embodiments, or is in a range of about 10 nm to about 16 nm in other embodiments. The minimum width W5 of the fin structure at the level H4 is in a range of about 6 nm to 14 nm in some embodiments, or is in a range of about 8 nm to about 12 nm in other embodiments. The width W6 of the fin structure is in a range of about 7 nm to 18 nm in some embodiments, or is in a range of about 8 nm to about 14 nm in other embodiments.

Figure 7:
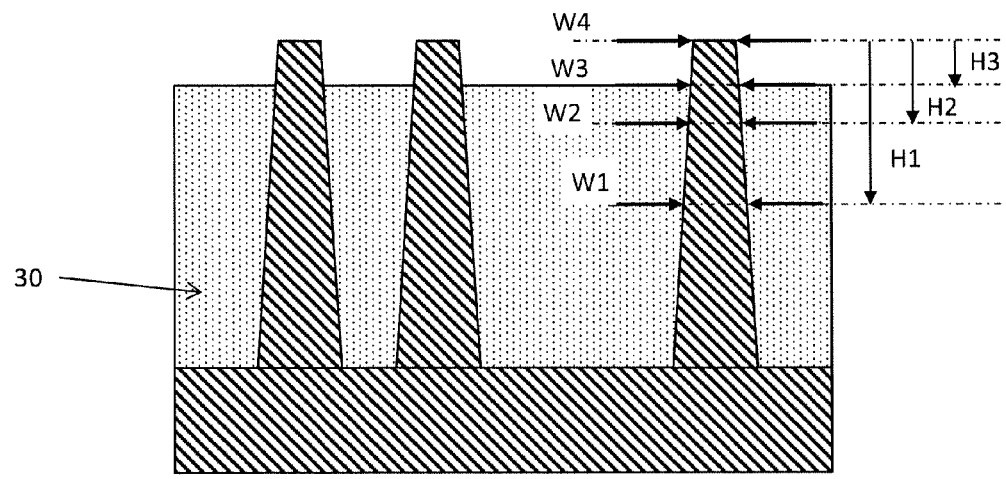
FIGS. 7-9 show exemplary cross sectional views illustrating sequential processes for manufacturing a Fin FET device according to another embodiment of the present disclosure.
Figure 8:
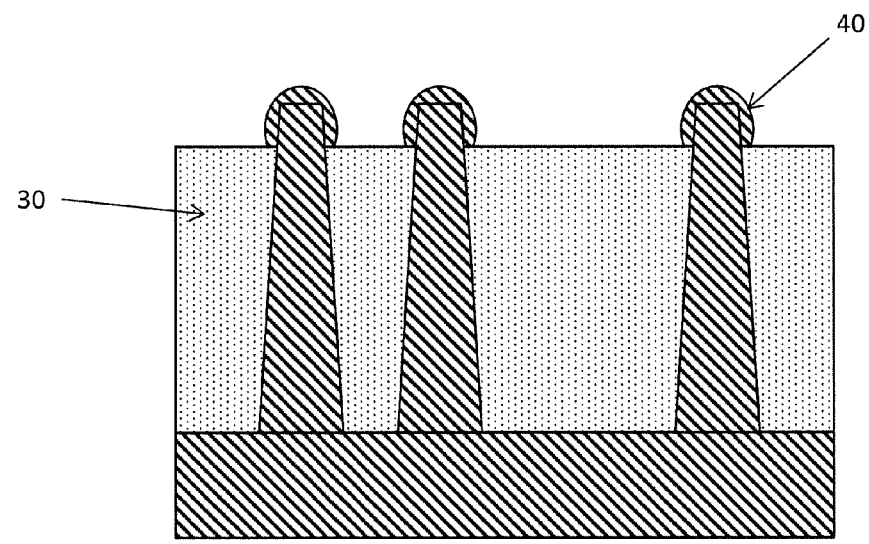
Figure 9:
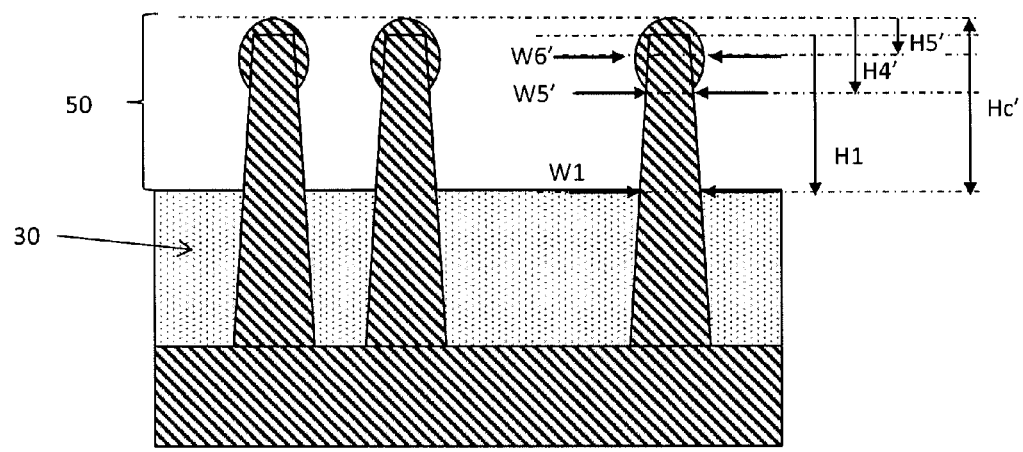

FIGS. 7-9 show exemplary cross sectional views illustrating sequential processes for manufacturing a Fin FET device according to another embodiment of the present disclosure. The structures, materials, configurations, operations and processes same as or similar to those of FIGS. 1-6 are applicable to this embodiment and the detailed explanation may be omitted.

While in FIG. 4, the isolation insulating layer 30 is recessed to the height H2, in FIG. 7, the isolation insulating layer 30 is recessed to the height H3, so as to expose the upper portions of the fin structures 20.

After the isolation insulating layer 30 is recessed, the width W1 of the fin structure at the height H1 is in a range of about 8 nm to 18 nm in some embodiments, or is in a range of about 10 nm to about 16 nm in other embodiments. The width W2 of the fin structure at the height H2 is in a range of about 6 nm to 17 nm in some embodiments, or is in a range of about 9 nm to about 15 nm in other embodiments. The width W3 of the fin structure at the height H3 is in a range of about 5 nm to 13 nm in some embodiments, or is in a range of about 6 nm to about 12 nm in other embodiments. The width W4 of the fin structure near the top of the fin structure is in a range of about 4 nm to 12 nm in some embodiments, or is in a range of about 5 nm to about 10 nm in other embodiments.

Similar to FIG. 5, an epitaxial layer 40 is formed over the exposed upper portions of the fin structures 20, as shown in FIG. 8.

Then, similar to FIG. 6, the thickness of the isolation insulating layer 30 is further reduced to the height H1, as shown in FIG. 9. The cross section of the upper portion of the fin structure is generally an oval, and the entire cross sectional shape of the fin structures is similar to a "bowling pin." Similar to FIG. 6, the fin structure above the upper surface of the isolation insulating layer, which will become a channel region 50 of the Fin FET, the width of the fin structure along the Y direction changes, taking the width W1 at the height H1, the minimum width W5' at a level (or height) H4' and the maximum W6' at a level H5', as shown in FIG. 9. In one embodiment, W5'<W1<W6', and in other embodiments, W5'<W6'<W1, and in such a case the W6' is a local maximum above H4'. In some embodiments, W6'/W5' is in a range of about 1.1 to about 1.5 and is in a range of about 1.15 to 1.3 in other embodiments.

The level H4' is located at about 10% to about 40% of the total channel height Hc' from the top of the channel region in some embodiments, and in other embodiments, is located at about 15% to 30% of H'c from the top. The level H5' is located at about 5% to about 30% of the total channel height Hc' from the top of the channel region in some embodiments, and in other embodiments, is located at about 10% to 20% of Hc from the top.

The width W1 of the fin structure at the height H1, after the isolation insulating layer is second recessed, is in a range of about 8 nm to 18 nm in some embodiments, or is in a range of about 10 nm to about 16 nm in other embodiments. The minimum width W5' of the fin structure at the level H4' is in a range of about 5 nm to 13 nm in some embodiments, or is in a range of about 7 nm to about 11 nm in other embodiments. The width W6' of the fin structure is in a range of about 7 nm to 17 nm in some embodiments, or is in a range of about 8 nm to about 13 nm in other embodiments.

Figure 10:
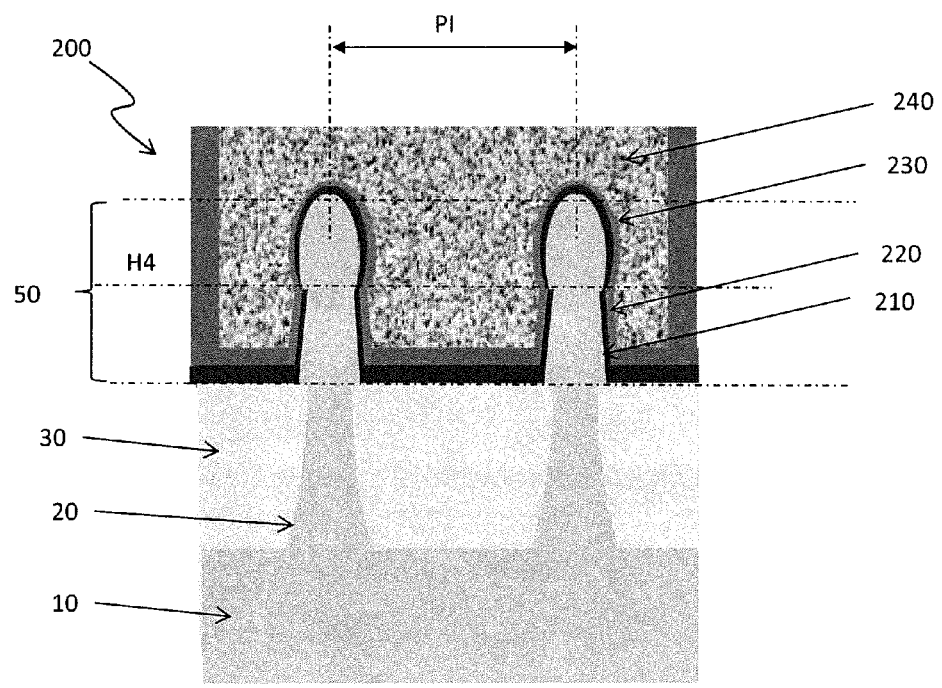
FIGS. 10-12 are exemplary cross sectional views of a Fin FET device according to various embodiments of the present disclosure.
Figure 11:
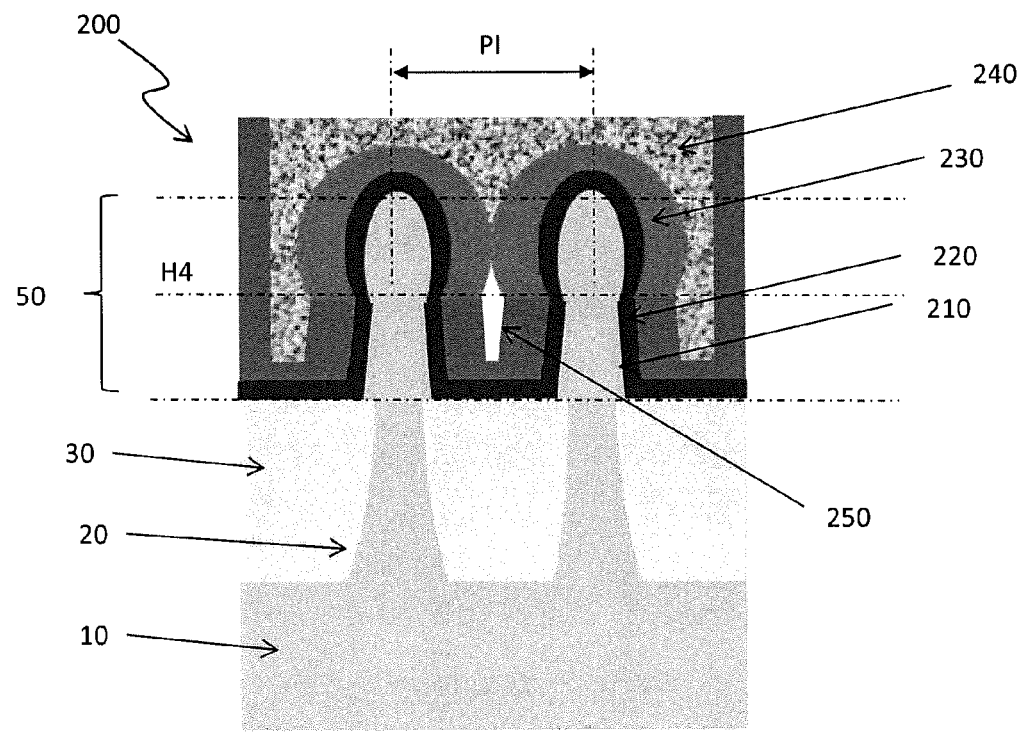
Figure 12:
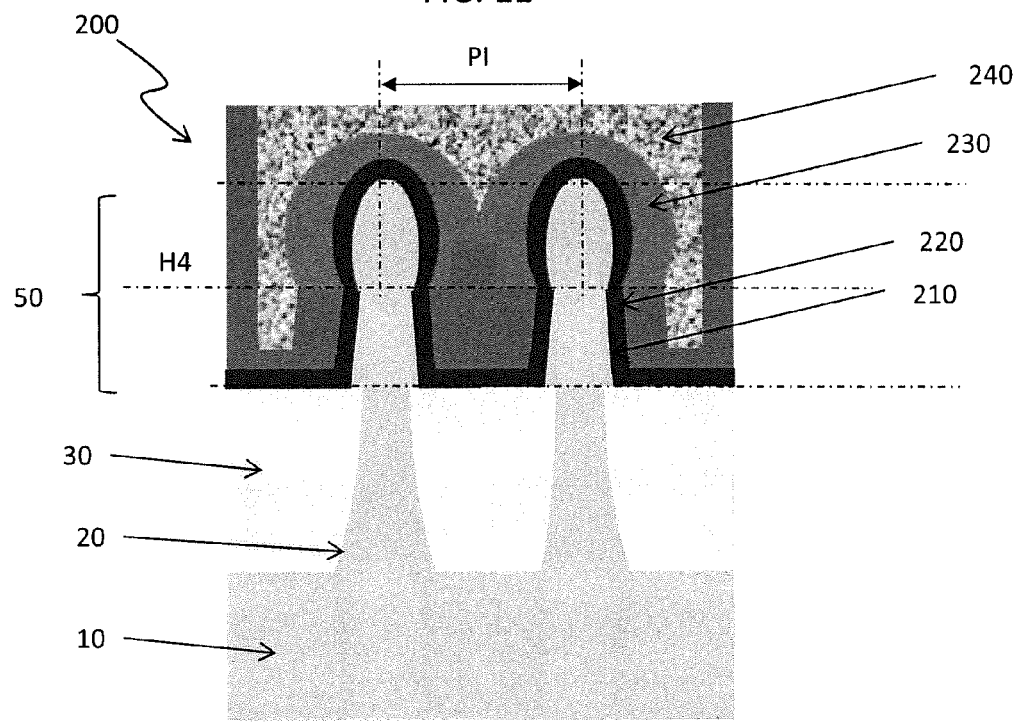

After the channel regions 50 are exposed in FIG. 6 or 9, a gate structure is formed over the fin structures 20. FIGS. 10-12 are exemplary cross sectional views of a Fin FET device according to various embodiments of the present disclosure, after a gate structure 200 is formed.

The gate structure 200 may be formed by a "gate-first" process or a "gate-last" (or replacement gate) process. FIGS. 10-12 show the case of the "gate-last" process.

In the gate last process, a dummy gate structure including a dummy gate dielectric layer and a dummy gate electrode layer is formed over the channel region and then the fin structure not covered by the dummy gate structure is recessed below the isolation insulating layer. Then, source and drain structures (not shown) are formed in the recessed portion to extend over the isolation insulating layer. A dielectric layer as an interlayer dielectric (ILD) layer (not shown) is formed over the dummy gate structure and the source drain structures. After a planarization operation to the ILD layer, the dummy gate structure is removed to from a gate space, in which the channel region of the fin structure is exposed. Then, an interfacial layer 210 is formed on the exposed channel region, and a gate dielectric layer 220 is formed over the interfacial layer 210 (and the isolation insulating layer 30). Further, a work function adjustment layer 230 is formed over the gate dielectric layer 220, and then a gate electrode layer 240 is formed over the work function adjustment layer 230 (see FIG. 10).

The interfacial layer 210 includes a thin insulating layer made of, for example, silicon oxide with a thickness of about 1 nm to 3 nm. The interfacial layer may be omitted.

The gate dielectric layer 220 may include one or more layers of silicon oxide, silicon nitride, silicon oxy-nitride, or high-k dielectric materials. High-k dielectric materials comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, one or more layer of $HfO_2$, HfSiO, HfSiON, HfTaO, HMO, HfZrO, zirconium oxide, aluminum oxide, titanium oxide, hafnium dioxide-alumina ($HfO_2$—$Al_2O_3$) alloy are used as a high-k dielectric material. The thickness of the gate dielectric layer 220 is in the range of about 1 nm to 7 nm.

The work function adjustment layer 230 includes one or more layers of TiN, TaN, TaAlC, TiC, TaC, Co, Al, TiAl, HfTi, TiSi, TaSi or TiAlC. For the n-channel Fin FET, one or more layers of TaN, TaAlC, TiN, TiC, Co, TiAl, HfTi, TiSi and TaSi may be used as the work function adjustment layer, and for the p-channel Fin FET, one or more layers of TiAlC, Al, TiAl, TaN, TaAlC, TiN, TiC and Co is used as the work function adjustment layer. The work function adjustment layer may be formed by ALD, PVD, CVD, e-beam evaporation, electroplating or other suitable process. Further, the work function adjustment layer may be formed separately for the n-channel Fin FET and the p-channel Fin FET which may use different metal layers. The work function adjustment layer may be omitted.

The gate electrode layer 240 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 240 may be formed by ALD, PVD, CVD, e-beam evaporation, electroplating or other suitable process.

The thickness of the work function adjustment layer 230 may vary. FIG. 10 shows an embodiment, where the thickness of the work function adjustment layer 230 is relatively small. In some embodiments, the thickness of the work function adjustment layer 230 is in a range of about 5 nm to about 10 nm. In FIG. 10, the pitch PI of the adjacent fin structures 20 is relatively large, for example, in a range of about 3×W6 (or W6') to about 6×W6 (or W6'). In such a case, the work function adjustment layer 230 can be conformally formed over the channel region 50 and the gate electrode layer 240 can fill the space between the adjacent channel regions. In FIG. 10, since the work function adjustment layer 230 can be conformally formed over the channel region 50, the bottom the gate electrode layer 240 is located below the level H4 (or H4').

FIGS. 11 and 12 show the cases where the thickness of the work function adjustment layer 230 becomes thicker and/or the pitch PI becomes smaller.

In FIGS. 11 and 12, the thickness of the work function adjustment layer 230 is in a range of about 4 nm to about 25 nm, and the pitch PI of the adjacent fin structures 20 is in a range of about 2×W6 (or W6') to about 4×W6 (or W6'). In such a case, the work function adjustment layer 230 forms an overhang and may create a void 250 between the adjacent channel regions, as shown in FIG. 11. In certain embodiments, the pitch PI ranges from about 20 nm to about 50 nm. In other embodiments, the work function adjustment layer 230 fully fills the space between the adjacent channel regions, and side faces of the work function adjustment layer 230 merge together as shown in FIG. 12. In FIGS. 11 and 12, since the space between the adjacent channel regions is filled with the work function adjustment layer 230, the bottom the gate electrode layer 240 is located above the level H4 (or H4').

The various embodiments or examples described herein offer several advantages over the existing art. For example, in the present disclosure, since the upper portion of a channel region in a fin structure has an oval or a bowling-pin shape, the effective channel area can be increased, and the FET performance can be improved. Further, the rounded shape of the channel region can also prevent electric field concentration, which would occur at sharp corners.

It will be understood that not all advantages have been necessarily discussed herein, no particular advantage is required for all embodiments or examples, and other embodiments or examples may offer different advantages.

In accordance with one aspect of the present disclosure, a method for manufacturing a semiconductor device includes forming a fin structure over a substrate. The fin structure has a top surface and side surfaces and the top surface is located at a height H0 measured from the substrate. An insulating layer is formed over the fin structure and the substrate. In a first recessing, the insulating layer is recessed to a height T1 measured from the substrate, so that an upper portion of the fin structure is exposed from the insulating layer. A semiconductor layer is formed over the exposed upper portion of the fin structure. After forming the semiconductor layer, in a second recessing, the insulating layer is recessed to a height T2 measured from the substrate, so that a middle portion of the fin structure is exposed from the insulating layer. A gate structure is formed over the upper portion with the semiconductor layer and the exposed middle portion of the fin structure.

In accordance with another aspect of the present disclosure, a semiconductor device includes a fin field effect transistor (Fin FET). The Fin FET comprises a fin structure disposed over a substrate, an isolation insulating layer and a gate structure. The fin structure includes a channel region of the Fin FET. The isolation insulating layer is disposed over the substrate and covers a lower part of the fin structure. The channel region of the Fin FET protrudes from the isolation insulating layer. The gate structure is disposed over the channel region. The channel region has a first width W1 at a surface level of the isolation insulating layer, a minimum width W5 at a first level above the surface level, and a maximum width W6 of the channel region above the first level at a second level above the first level.

In accordance with another aspect of the present disclosure, a semiconductor device includes a fin field effect transistor (Fin FET). The Fin FET comprises at least two fin structures, an isolation insulating layer and a gate structure. The fin structures are disposed over a substrate and the fin structures respectively include channel regions of the Fin FET. The isolation insulating layer is disposed over the substrate and covers lower parts of the fin structures. The channel regions of the Fin FET protrude from the isolation insulating layer. The gate structure is disposed over the channel regions. A distance from an upper surface of the isolation insulating layer increases in an upward direction, a width of the channel regions decreases, reaches a minimum width at a first level, then increases and reaches a maximum width, which is a maximum width above the first level. The gate structure includes a gate dielectric layer disposed over the channel regions, a work function adjustment layer disposed over the gate dielectric layer and a gate electrode layer disposed over the work function adjustment layer. A lowest portion of the gate electrode layer between the channel regions is located above the first level.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a plurality of fin structures over a substrate, the fin structures having a top surface and side surfaces, the top surface being located at a height H0 measured from the substrate;
    forming an insulating layer over the fin structures and the substrate;
    first recessing the insulating layer to a height T1 measured from the substrate, so that an upper portion of the fin structures is exposed from the insulating layer;
    forming a semiconductor layer over the exposed upper portion of the fin structures;
    after forming the semiconductor layer, second recessing the insulating layer to a height T2 measured from the substrate, so that a middle portion of the fin structures is exposed from the insulating layer;
    forming a gate dielectric layer over the upper portion with the semiconductor layer and the exposed middle portion of the fin structures;
    conformally forming a work function adjustment layer over the gate dielectric layer so that between adjacent fin structures side faces of the work function adjustment layer merge; and
    forming a gate electrode layer over the work function adjustment layer, wherein:
    the upper portion with the semiconductor layer and the exposed middle portion of the fin structures constitute a channel region,
    the channel region has a minimum width at a first level above a surface level of the insulating layer after the second recessing, a maximum width above the first level at a second level above the first level, and
    a lowest portion of the gate electrode between adjacent channel regions is located above the first level.

2. The method of claim 1, wherein T1 is in a range of T2 plus 40% to 60% of (H0-T2).

3. The method of claim 2, wherein a thickness of the semiconductor layer is in a range of 0.5 nm to 2 nm.

4. The method of claim 2, wherein the first level is located below a top of the channel region by 20-60% of a height of the channel region measured from the surface level.

5. The method of claim 1, wherein T1 is in a range of T2 plus 70% to 80% of (H0-T2).

6. The method of claim 5, wherein a thickness of the semiconductor layer is in a range of 0.5 nm to 2 nm.

7. The method of claim 5, wherein the first level is located below a top of the channel region by 10-40% of a height of the channel region measured from the surface level.

8. A semiconductor device including a fin field effect transistor (Fin FET), the Fin FET comprising:
    at least two fin structures disposed over a substrate, the fin structures including a channel region of the Fin FET;
    an isolation insulating layer disposed over the substrate and covering a lower part of the fin structures, the channel region of the Fin FET protruding from the isolation insulating layer;
    a gate structure including a gate dielectric layer, work function adjustment layer, and gate electrode disposed in this order over the channel region, wherein:
    the channel region has a first width W1 at a surface level of the isolation insulating layer, a minimum width W5 at a first level above the surface level, a maximum width W6 of the channel region above the first level at a second level above the first level, and W5 <W6 ≤W1,
    between adjacent fin structures side faces of the work function adjustment layer are merged, and
    a lowest portion of the gate electrode between adjacent channel regions is located above the first level.

9. The semiconductor device of claim 8, wherein a cross section of an upper portion of the channel region above the first level has an oval shape.

10. The semiconductor device of claim 8, wherein a cross section of the channel region has a bowling-pin shape.

11. The semiconductor device of claim 8, wherein W6/W5 is in a range of 1.1 to 1.5.

12. The semiconductor device of claim 8, wherein the first level is located below a top of the channel region by 20-60% of a height of the channel region measured from the surface level.

13. The semiconductor device of claim 8, wherein the first level is located below a top of the channel region by 10-40% of a height of the channel region measured from the surface level.

14. The semiconductor device of claim 8, wherein the maximum width W6 ranges from 7 nm to 18 nm.

15. The semiconductor device of claim 8, wherein the minimum width W5 ranges from 6 nm to 14 nm.

16. A semiconductor device including a fin field effect transistor (Fin FET), the Fin FET comprising:
    at least two fin structures disposed over a substrate, the fin structures respectively including channel regions of the Fin FET;
    an isolation insulating layer disposed over the substrate and covering lower parts of the fin structures, the channel regions of the Fin FET protruding from the isolation insulating layer;
    a gate structure disposed over the channel regions, wherein:
    as a distance from an upper surface of the isolation insulating layer increases in an upward direction, a width of the channel regions decreases, reaches a minimum width at a first level, then increases and reaches a maximum width, which is a maximum width above the first level, the gate structure includes a gate dielectric layer disposed over the channel regions, a work function adjustment layer disposed over the gate dielectric layer and a gate electrode layer disposed over the work function adjustment layer, a lowest portion of the gate electrode layer between the channel regions is located above the first level, and the work function adjustment layer fully fills a space between the channel regions below the first level.

17. The semiconductor device of claim 16, wherein the first level is located below a top of the channel region by 20-60% of a height of the channel region measured from the upper surface of the isolation insulating layer.

18. The semiconductor device of claim 16, wherein the first level is located below a top of the channel region by 10-40% of a height of the channel region measured from the upper surface of the isolation insulating layer.

19. The semiconductor device of claim 16, wherein a cross section of an upper portion of the channel region above the first level has an oval shape.

20. The semiconductor device of claim 16, wherein a cross section of the channel region has a bowling-pin shape.

\* \* \* \* \*